United States Patent
Lee

(10) Patent No.: US 7,112,996 B2
(45) Date of Patent: Sep. 26, 2006

(54) LEVEL SHIFTER FOR DETECTING GROUNDED POWER-SUPPLY AND LEVEL SHIFTING METHOD

(75) Inventor: Jong-Hwa Lee, Suwon-si (KR)

(73) Assignee: Samsung Electronics, Co., Ltd., (KR)

(*) Notice: Subject to any disclaimer, the term of this patent is extended or adjusted under 35 U.S.C. 154(b) by 35 days.

(21) Appl. No.: 10/894,679

(22) Filed: Jul. 19, 2004

(65) Prior Publication Data
US 2005/0024088 A1 Feb. 3, 2005

(30) Foreign Application Priority Data
Aug. 1, 2003 (KR) .................... 10-2003-0053533

(51) Int. Cl.
*H03K 19/0175* (2006.01)
*H03K 19/094* (2006.01)

(52) U.S. Cl. .................... 326/68; 326/63; 326/80; 326/81; 326/82; 326/83; 326/86

(58) Field of Classification Search ............ 326/68, 326/63, 80–83, 86
See application file for complete search history.

(56) References Cited

U.S. PATENT DOCUMENTS

| 5,214,322 A | * | 5/1993 | Neidorff et al. ............ 327/437 |
| 5,698,993 A | * | 12/1997 | Chow ......................... 326/81 |
| 5,781,026 A | * | 7/1998 | Chow ......................... 326/26 |
| 6,043,699 A | * | 3/2000 | Shimizu ...................... 327/333 |
| 6,753,697 B1 | * | 6/2004 | Nakase ........................ 326/68 |
| 6,759,872 B1 | * | 7/2004 | Lai et al. ..................... 326/81 |
| 6,822,479 B1 | * | 11/2004 | Rosen ......................... 326/68 |

FOREIGN PATENT DOCUMENTS

| EP | 0999644 A1 | 10/2000 |
| KR | 99-45238 A | 6/1999 |
| WO | 01/65696 A2 | 9/2001 |

OTHER PUBLICATIONS

Rhyne (Fundamentlas of Digital Systems Design, N.J., 1973 pp. 70-71, no month.*

* cited by examiner

Primary Examiner—Rexford Barnie
Assistant Examiner—Jason Crawford
(74) Attorney, Agent, or Firm—Mills & Onello LLP

(57) ABSTRACT

A level shifter includes an input buffer, a level shifting circuit, a voltage level detecting circuit, an output buffer and a reference logic circuit. The input buffer buffers a small range input signal to output a small range signal. The level shifting circuit transforms the small range signal into a first wide range signal. The voltage level detecting circuit detects whether a power voltage of a low voltage stage is at the ground level, and prevents an indefinite logic state of the level shifter. The output buffer buffers the first wide range signal to output a second wide range signal. The reference logic circuit generates a wide range signal having a predetermined logic status when the power voltage is at the ground level. Thus, a leakage current of the level shifter is reduced.

19 Claims, 6 Drawing Sheets

LEVEL SHIFTER FOR DETECTING GROUNDED POWER-SUPPLY AND LEVEL SHIFTING METHOD

CROSS-REFERENCE TO RELATED APPLICATIONS

This application relies for priority upon Korean Patent Application No. 2003-53533 filed on Aug. 1, 2003, the contents of which are herein incorporated by reference in its entirety.

BACKGROUND OF THE INVENTION

1. Field of the Invention

The present invention relates to a voltage level shifter and a level shifting method for shifting a small range signal to a wide range signal.

2. Description of the Related Art

Generally, laptop computers and portable devices require low power consumption, and widely adopt a multi-power architecture which implements a small range voltage and a wide range voltage are used. Typically, such multi-power architectures require level-shifting circuits to provide voltage and power driving interfaces between circuits operating at different power voltage levels. Such level shifting circuits commonly include an input buffer receiving an input signal driven at a first power supply voltage level, a level shifting circuit for shifting the operating level of the input signal to a second power supply voltage level, an output buffer circuit which operates at the second voltage level, and a pull-up/pull-down circuit.

In such conventional circuits, the pull-up/pull-down circuit is implemented as integrated circuits including, for example, diode-connected transistors or resistors. These conventional circuits commonly occupy a large area and induce additional static current consumption.

FIG. 1 is a circuit diagram of a conventional low-to-high voltage level shifter.

Referring to FIG. 1, the conventional level shifter has an input buffer 110, a level shifting circuit 120, an output buffer 130 and a pull-up/pull-down circuit 140.

The conventional level shifter shifts an input signal having a small range to a wide range signal.

The input buffer 110 includes a first inverter 112 having a PMOS transistor M1' and an NMOS transistor M2', and a second inverter 114 having a PMOS transistor M3' and an NMOS transistor M4'. The input buffer 110 is activated by a first power voltage VADDL having a low voltage level. The input signal LI is buffered by the first inverter 112 and the second inverter 114. A first small range signal having the same logic level as the input signal LI is outputted via a node N2'. A second small range signal having a reverse logic with respect to the input signal LI is outputted via a node N1'.

The level shifting circuit 120 includes a cross-coupled pair having PMOS transistors M5', M7', and NMOS transistors M6', M8'. The level shifting circuit 120 is activated by a second power voltage VADDH having a high voltage level. Furthermore, the level shifting circuit 120 shifts the small range input signal to a wide range signal by using a positive feedback circuit. In particular, the level shifting circuit 120 shifts first and second small range signals to a first wide range signal via a node N3' and a second wide range signal via node N4'.

The output buffer 130 has PMOS transistors M9' and M11', and NMOS transistors M10', M12'. The output buffer 130 is activated by the second power voltage VADDH. The first wide range signal at the node N3' and the second wide range signal at the node N4' are determined by a logic state of the input signal LI. The output buffer 130 buffers the first and second wide range signals, and transforms the first and second wide range signals into third and fourth wide range signals that have enough power to drive an output load. The third and fourth wide range output signals are output via nodes N7 and N8, respectively. The third wide range signal has the same logic state as the input signal LI, and the fourth wide range signal has the reverse logic state with respect to the input signal LI.

The pull-up/pull-down circuit 140 has a pull-up transistor M13' and a pull-down transistor M14'. The pull-up/pull-down circuit 140 is activated by the second power voltage VADDH. When a low voltage stage does not operate, the pull-up/pull-down circuit 140 maintains an output node voltage as a predetermined logic state based on pull down or pull up control signals PD and PDB so as to avoid an undefined logic state of the wide range signals. The pull down or pull up control signals PD and PDB are generated by an external source. The pull-up control signal PDB has a reverse logic status with respect to the pull-down control signal PD, or may have logic status irrelevant to the pull-down control signal PD.

Hereinafter, the operation of the conventional level shifter is illustrated with reference to FIG. 1.

When the small range input signal LI having a low-voltage logic level 'HIGH' is inputted to first inverter 112, the node N2' has the low-voltage logic level 'HIGH' and the node N1' has the low-voltage logic 'LOW'. The transistor M6' of the level shifting circuit 120 is turned on by the logic 'HIGH' of the node N2', and the transistor M8' is turned off by the logic 'LOW' of the node N1'. Thus, a current path including the transistor M5' and M6' are disabled.

A logic level of the node N3' is 'LOW' and the transistor M7' is turned on by the logic 'LOW' of the node N3'. Because the transistor M7' is turned on, the logic level of the node N4' is a high-voltage logic level 'HIGH', so that the transistor M5' is turned off. Thus, a current path including the transistor M7' and M8' is disabled.

The high-voltage logic level 'HIGH' is substantially the same as VADDH and the high-voltage logic level 'LOW' is substantially the same as VSS. Furthermore, when the small range input signal LI has the low-voltage logic level 'LOW', the logic level of the node N3' is high-voltage logic level 'HIGH' and the logic of the node N4' is high-voltage logic level 'LOW'.

When the small range input signal LI having a low-voltage logic level 'LOW' is inputted to first inverter 112, the node N2' has the low-voltage logic level 'LOW' and the node N1' has the low-voltage logic 'HIGH'.

The output buffer 130 buffers the output signal of the nodes N3' and N4' having the logic levels defined by the logic state of the input signal LO, and outputs a third wide range signal (a voltage of the node N7') having the same logic status as the input signal L1 and a fourth wide range signal (a voltage of the node N8') having the reverse logic state with respect to the input signal LI. The third and fourth wide range signals have enough power to drive an output load.

When the first power voltage VADDL has a substantially ground level, in the conventional level shifter, the transistors M6' and M8' turned off due to the logic state 'LOW' of the input signal L1, the node N1' voltage, and the node N2' voltage. In addition, the node N3' and N4' are in floating state.

Furthermore, when the floated node N3' and N4' reach a high level enough to turn off transistors M5' and M7', transistors M5', M6', M7' and M8' are turned off and nodes N3', N4' have an unknown logic state or a floating state.

When the node N4' (or node N3') has a voltage level low enough to turn on the transistor M5' (or transistor M7'), a positive feedback loop formed by the transistors M5' and M7' is activated. By the positive feedback loop, one of the nodes N3' and N4' has the high-voltage logic level 'HIGH', and the other node of the nodes N3' and N4' has a floating state.

In particular, in the case in which the node N4' has a voltage level low enough to turn on the transistor M5', the transistor M5' is turned on and the node N4' is in the floating state due to the high-voltage logic level 'HIGH' of the node N3'. Furthermore, in the case in which the node N3' has a voltage level low enough to turn on the transistor M7', the node N3' is in the floating state due to the high-voltage logic level 'HIGH' of the node N4'.

In the case in which the node N3' (or node N4') has an unknown logic status, the logic level of the node N3' (or node N4') varies depending upon a fabrication condition of the level shifter, a peripheral circuit condition or noise. Accordingly, when the pull-up circuit or the pull-down circuit is not used, the third wide range signal (the voltage at the node N7') or the fourth wide range signal (the voltage at the node N8') is in the unknown logic status, and the level shifter may no longer output correct wide range signals.

When the first power voltage VADDL is disabled, a power of first power voltage ADDL is not supplied, or a voltage level of the first power voltage VADDL decreases to a ground level, the first power voltage VADDL has substantially a ground level GND. The pull-up circuit or the pull-down circuit prevents the unknown logic state of the third and fourth wide range signals.

When the pull-up/pull-down circuit 140 integrated by an integrated circuit of transistors may have an area smaller than a pull-up/pull-down circuit integrated by an integrated circuit of diode-connected transistors or resistors. However, the pull-up/pull-down circuit 140 realized by the integrated circuit may consume large static current and requires separate control signals (PDB, PD of FIG. 1) for controlling the transistors M13' and M14'.

That is, when the low voltage stage is disabled by the disabled first power voltage VADDL, the conventional level shifter additionally requires a pull-up/pull-down circuit that consumes a static current so as to maintain the third and fourth wide range signals as definite logic state. Furthermore, the conventional level shifter needs the separate control signals for selecting a normal operation or a pull-up/pull-down operation.

When the pull-up/pull-down circuit integrated by an integrated circuit of diode-connected transistors or resistors occupies a large area and induces additional static current consumption.

SUMMARY OF THE INVENTION

Accordingly, the present invention is provided to substantially obviate one or more problems due to limitations and disadvantages of the related art.

According to the present invention, there is provided a level shifter and associated level shifting method, which detect whether a power voltage of a low voltage stage is at the ground level and prevent an indefinite logic state of the level shifter.

In one aspect of the invention, a level shifter in accordance with the invention includes: an input buffer, coupled to a first power voltage, configured to buffer an input signal swinging between a base level and a first voltage level to output a first small range signal having a reversed phase with respect to the input signal and a second small range signal having substantially the same phase with respect to the input signal; a level shifting circuit, coupled to a second power voltage higher than the first power voltage, configured to transform the first and second small range signals into a first wide range signal and a second wide range signal, respectively, to output the first wide range signal via a first node and the second wide range signal via a second node when the first power voltage is higher than a given voltage level, the first and second wide range signals swinging between the base level and a second voltage level higher than the first voltage level; and a voltage level detecting circuit configured to detect whether the first power voltage is lower than the given voltage level, and configured to maintain voltage levels of the first and second nodes as higher than or equal to a third voltage level to prevent floating of the first and second nodes, the third voltage level being lower than the second voltage level.

In another aspect of the invention, a level shifter includes: an input terminal coupled to an input signal having a small range swinging between a base level and a first voltage level; a first power voltage terminal coupled to a first power voltage; a second power voltage terminal coupled to a second power voltage higher than the first power voltage; an input buffer, coupled to the first power voltage, configured to buffer the input signal to output a first small range signal having a reversed phase with respect to the input signal and a second small range signal having substantially the same phase with respect to the input signal; a level shifting circuit coupled to the input buffer and the second power voltage terminal, configured to transform the first and second small range signals into first and second wide range signals, respectively, when the first power voltage is higher than a given voltage level, and configured to output the first and second wide range signals via first and second nodes, respectively, the second wide range signal swinging between the base level and a second voltage level higher than the first voltage level; and a voltage level detecting circuit, coupled to the level shifting circuit and the second power voltage terminal, configured to detect whether the first power voltage is lower than the given voltage level, and configured to maintain voltage levels of the first and second node as higher than or equal to a third voltage level to prevent floating of the first and second nodes, the third voltage level being lower than the second voltage level.

In still another aspect of the invention, a level shifter includes: a first inverter coupled to a first power voltage, configured to invert an input signal to output a first small range signal having a reversed phase with respect to the input signal; a second inverter coupled to the first power voltage, configured to invert the first small range signal to output a second small range signal having substantially the same phase with respect to the input signal; a first NMOS transistor having a control electrode coupled to the first small range signal; a second NMOS transistor having a control electrode coupled to the second small range signal; a first PMOS transistor having a first current electrode coupled to a second power voltage and a second current electrode coupled to a second current electrode of the first NMOS transistor, the second power voltage being higher than the first power voltage; a second PMOS transistor having a first current electrode coupled to the second power voltage, a second current electrode coupled to a second current electrode of the second NMOS transistor and a control electrode of the first PMOS transistor, and a control electrode coupled to the second current electrode of the first PMOS transistor; a first transistor having a second current electrode and a control electrode commonly coupled to the second current electrode of the first PMOS transistor; a second transistor having a control electrode coupled to the first power voltage, configured to be turned on to form a first conduction path between the first and second PMOS transistors when the first power voltage is lower than a given voltage level; a third transistor having a second current electrode and a control electrode commonly coupled to the second current electrode of the second PMOS transistor; and a fourth transistor having a control electrode coupled to the first power voltage, configured to be turned on to form a second conduction path between the first and second PMOS transistors when the first power voltage is lower than the given voltage level.

In still another aspect of the invention, a level shifter includes: an input buffer, coupled to a first power voltage, configured to buffer an input signal swinging between a base level and a first voltage level to output a small range signal; a level shifting circuit, coupled to a second power voltage higher than the first power voltage, configured to transform the small range signal into a first wide range signal to output the first wide range signal when the first power voltage is higher than a given voltage level, the first wide range signal swinging between the base level and a second voltage level higher than the first voltage level; and a voltage level detecting circuit configured to detect whether the first power voltage is lower than the given voltage level, and configured to maintain a voltage level of the first wide range signal as higher than or equal to a third voltage level, the third voltage level being lower than the second voltage level.

In still another aspect of the invention, a level shifting method includes: receiving a first power voltage, and buffering an input signal swinging between a base level and a first voltage level to output a first small range signal having a reversed phase with respect to the input signal and a second small range signal having substantially the same phase with respect to the input signal; receiving a second power voltage higher than the first power voltage, and transforming the first and second small range signals into a first wide range signal and a second wide range signal, respectively, to output the first and second wide range signals when the first power voltage is higher than a given voltage level, the first and second wide range signals swinging between the base level and a second voltage level higher than the first voltage level; maintaining voltage levels of the first and second wide range signals as higher than or equal to a third voltage level when the first power voltage is lower than the given voltage level, the third voltage level being lower than the second voltage level; buffering the first and second wide range signals to output third and fourth wide range signals, respectively, swinging between the base level and the second voltage level; outputting a fifth wide range signal having substantially the same phase with respect to the input signal when the first power voltage is equal to or greater than the given voltage level; and outputting the fifth wide range signal having a predetermined logic level regardless of the logic level of the input signal when the first power voltage is lower than the given voltage level.

In still another aspect of the invention, a level shifting method includes: receiving a first power voltage, and buffering an input signal swinging between a base level and a first voltage level to output a small range signal swinging between the base level and the first voltage level; receiving a second power voltage higher than the first power voltage, and transforming the small range signal into a first wide range signal when the first power voltage is higher than a given voltage level, the first wide range signal swinging between the base level and a second voltage level higher than the first voltage level; maintaining a voltage level of the first wide range signal as higher than or equal to a third voltage level when the first power voltage is lower than the given voltage level, the third voltage level being lower than the second voltage level; buffering the first wide range signal to output a second wide range signal swinging between the base level and the second voltage level; outputting a third wide range signal having substantially the same phase with respect to the input signal when the first power voltage is equal to or greater than the given voltage level; outputting the third wide range signal having a predetermined logic level regardless of the logic level of the input signal when the first power voltage is lower than the given voltage level; and outputting the third wide range signal having a predetermined logic level regardless of the logic level of the inpt signal when the first power voltage is lower than the given voltage level.

The level shifter according to above exemplary embodiments of the present invention may be used in a multi-power system, to which a small range power voltage and a wide range power voltage are supplied, for example, portable devices, which require a low power consumption, such as laptop computers, PDA (Personal Digital Assistants) or mobile phones, etc.

In particular, the level shifter according to above exemplary embodiments of the present invention may be used in a GPS (Global Positioning System) controller that is implemented in a mobile phone.

BRIEF DESCRIPTION OF THE DRAWINGS

The foregoing and other objects, features and advantages of the invention will be apparent from the more particular description of exemplary embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EXEMPLARY EMBODIMENTS

Hereinafter, 'VADDL' denotes a first power voltage or a first power voltage source, and 'VADDH' denotes a second power voltage or a second power voltage source. 'LI' denotes an input signal or an input node, and 'HO' denotes an output signal or an output node. 'VSS' may have a ground level or a predetermined negative voltage level. Furthermore, in order to avoid a body effect, the substrates of PMOS transistors may be connected to the second power voltage VADDH, and the substrates of NMOS transistors may be connected to VSS. Transistors activated by the first power voltage VADDL having a small range are thin-gate transistors, and transistors activated by the second power voltage VADDH having a wide range are thick-gate transistors.

Figure 2:
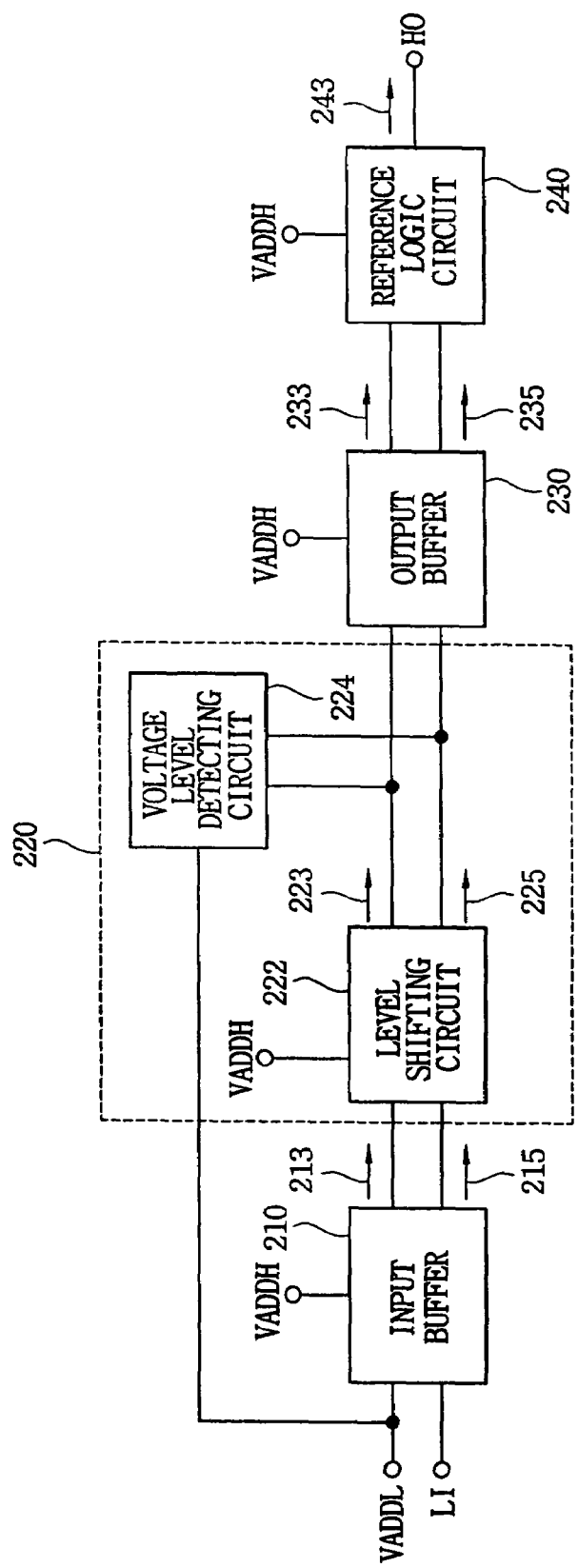
FIG. 2 is a block diagram of a low-to-high voltage level shifter according to an exemplary embodiment of the present invention.

FIG. 2 is a block diagram of a low-to-high voltage level shifter according to an exemplary embodiment of the present invention.

Referring to FIG. 2, a level shifter has an input buffer 210, a voltage level shifting circuit 220, an output buffer 230 and a reference logic circuit 240.

The level shifter shifts an input signal with a small range to an output signal with a wide range. That is, the level shifter receives the small range input signal swinging from a base voltage level to a first voltage level, and outputs the wide range output signal swinging from the base voltage level to a second voltage level. For example, the base voltage level may be a ground (GND) level or a negative voltage level. The first voltage level may correspond to VADDL and the second voltage level may correspond to VADDH. Hereinafter, a control electrode of a MOS transistor denotes a gate electrode, a first current electrode of a MOS transistor may denote a source electrode (or a drain electrode), and a second current electrode of a MOS transistor may denote a drain electrode (or a source electrode).

The input buffer 210 is activated by the first power voltage VADDL having the small range. The input buffer 210 receives a small range input signal LI, buffers the input signal LI, and outputs a first small range signal 213 having the same phase with respect to the input signal LI and a second small range signal 215 having a reversed phase with respect to the input signal LI. For example, the small range input signal LI swings between 0 volt and 1.5 volt.

The voltage level shifting circuit 220 has a level shifting circuit 222 and a voltage level detecting circuit 224.

The level shifting circuit 222 is activated by the second power voltage VADDH, and shifts small range signals to wide range signals. In particular, the level shifting circuit 222 converts the first small range signal 213 and the second small range signal 215 into a first wide range signal 223 and a second wide range signal 225, respectively, when the first power voltage VADDL has normal power voltage level.

The voltage level detecting circuit 224 detects a voltage level of the first power voltage VADDL. In the case in which the detected voltage level of the first power voltage VADDL is substantially higher than a given voltage level, the voltage level detecting circuit 224 allows the level shifting circuit 222 to output the first wide range signal 223 and the second wide range signal 225. For example, the given voltage level is substantially a ground (GND) level. For example, the given voltage level is lower than or equal to a threshold voltage Vthn of an NMOS transistor. Furthermore, when the detected voltage level of the first power voltage VADDL is substantially lower than the given voltage level, the voltage level detecting circuit 224 prevents the floating of the first wide range signal 223 and the second wide range signal 225. Accordingly, the voltage level detecting circuit 224 allows the first wide range signal 223 and the second wide range signal 225 to have a third voltage level. The third voltage level is lower than the second power voltage VADDL by a predetermined value, and corresponds to a high-voltage logic level.

The output buffer 230 buffers the first wide range signal 223 and the second wide range signal 225 to output a third Wide range signal 233 and a fourth wide range signal 235 that have sufficient power to drive an output load. Furthermore, the output buffer 230 generates the third wide range signal 233 and the fourth wide range signal 235 that have the high-voltage logic level 'HIGH' when the first voltage source VADDL is lower than the given voltage level.

The reference logic circuit 240 converts the third wide range signal 233 and the fourth wide range signal 235 into an output signal 243 (HO). The output signal 243(HO) has a high-voltage logic level corresponding to a low-voltage logic level of the small range input signal (LI) or a predetermined high-voltage logic level. That is, the reference logic circuit 240 maintains the output signal 243 (HO) as a predetermined logic status even when the first power voltage VADDL is below the given voltage level.

Embodiment 1

Figure 3:
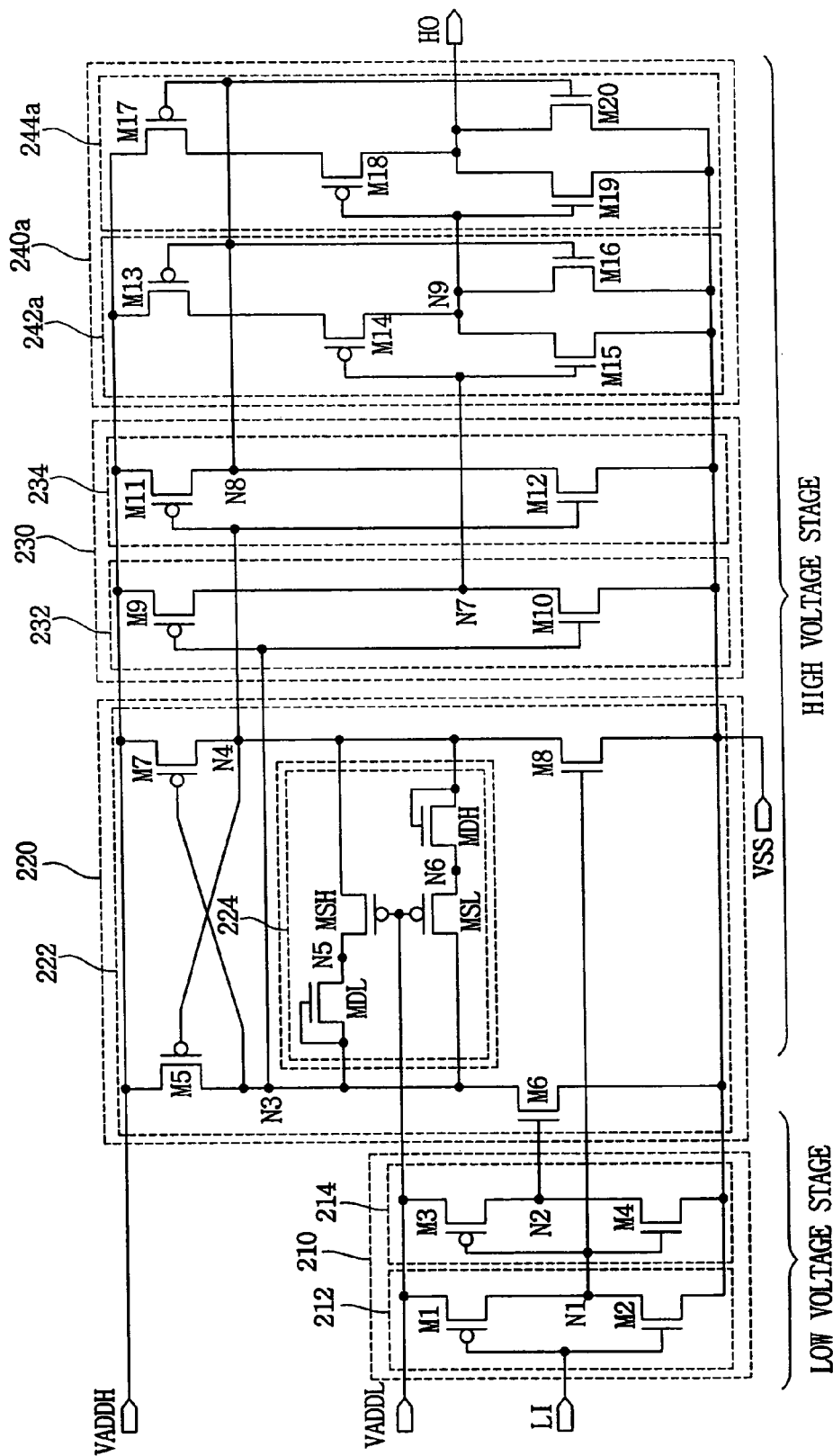
FIG. 3 is a circuit diagram of a low-to-high voltage level shifter of FIG. 2 according to a first exemplary embodiment of the present invention.

FIG. 3 is a circuit diagram of a low-to-high voltage level shifter of the FIG. 2 according to a first exemplary embodiment of the present invention.

Referring to FIG. 3, an input buffer 210 has a first inverter 212 and a second inverter 214. The first inverter 212 has a PMOS transistor M1 and an NMOS transistor M2. The second inverter 214 has a PMOS transistor M3 and an NMOS transistor M4.

The input buffer 210 is activated by a first power voltage VADDL having a low-voltage level. The input buffer 210 receives a small range input signal LI via the first inverter 212, outputs a first small range signal 213 having the same phase with respect to the input signal LI via a node N2 and outputs a second small range signal 215 having a reversed phase with respect to the input signal LI via a node N1.

A voltage level shifting circuit 220 has a level shifting circuit 222 and a voltage level detecting circuit 224.

The level shifting circuit 222 is activated by a second power voltage VADDH having a high-voltage level. Furthermore, the level shifting circuit 222 has PMOS transistors M5 and M7 and NMOS transistors M6 and M8 respectively coupled to a drain of the PMOS transistors M5 and M7. The PMOS transistors M5 and M7 have a cross-coupled pair configuration.

Specifically, a source of the PMOS transistor M5 is connected to the second power voltage VADDH. A drain of the NMOS transistor M6 is connected to the drain of the PMOS transistor M5 via a node N3, a gate of the NMOS transistor M6 is connected to the second node N2, i.e. an output node of the second inverter 214. A source of the PMOS transistor M6 is connected to base voltage level VSS. A source of the PMOS transistor M7 is connected to the second power voltage VADDH, and a gate of the PMOS transistor M7 is connected to the drain of the PMOS transistor M5. A gate of the NMOS transistor M8 is connected to the first node N1, i.e. an output node of the first inverter 212. The drain of the NMOS transistor M8 is connected to the drain of the PMOS transistor M7 via a node N4, and a source of the NMOS transistor M8 is connected to VSS.

The voltage level detecting circuit 224 prevents the floating of the nodes N3 and N4 by detecting whether the first power voltage VADDL is below the given voltage level.

The voltage level detecting circuit 224 has PMOS transistors MSH, MSL and NMOS transistors MDL, MDH. A gate of the NMOS transistor MDL is commonly connected to a drain of the NMOS transistor MDL and is connected to the drain of the NMOS transistor M6. A gate of the PMOS transistor MSH is connected to the first power voltage VADDL, a source of the PMOS transistor MSH is connected to a source of the transistor MDL, and a drain of the PMOS transistor MSH is connected to the node N4. A gate of the NMOS transistor MDH is commonly connected to a drain of the NMOS transistor MDH, and is connected to the drain of the PMOS transistor M7. A gate of the NMOS transistor MSL is connected to the first power voltage VADDL, a source of the NMOS transistor MSL is connected to the source of the transistor MDH, and a drain of the NMOS transistor MSL is connected to the drain of the PMOS transistor M5.

An output buffer 230 has a third inverter 232 including transistors M9, M10, and a fourth inverter 234 including transistors M11, M12.

A source of the PMOS transistor M9 is connected to the second power voltage VADDH, and a gate of the PMOS transistor M9 is connected to the node N3. A drain of the NMOS transistor M10 is connected to a drain of the PMOS transistor M9, and a source of the NMOS transistor M10 is connected to VSS. A source of the PMOS transistor M11 is connected to the second power voltage VADDH, and a gate of the PMOS transistor M11 is connected to the node N4. A gate of the NMOS transistor M12 is connected to the gate of the PMOS transistor M11, a drain of the NMOS transistor M12 is connected to the drain of the PMOS transistor M11, and a source of the NMOS transistor M11 is connected to VSS.

A reference logic circuit 240a has a first NOR GATE 242a and a second NOR GATE 244a. The first NOR GATE 242a includes transistors M13, M14, M15 and M16. The second NOR GATE 244a includes transistors M17, M18, M19 and M20.

A source of the PMOS transistor M13 is connected to the second power voltage source VADDH. A source of the PMOS transistor M14 is connected to a drain of the PMOS transistor M13 and a gate of the PMOS transistor M14 is connected to a node N7. A drain of the NMOS transistor M15 is connected to a drain of the PMOS transistor M14 via a node N9, a gate of the NMOS transistor M15 is connected to a gate of the transistor M14 and a source of the NMOS transistor M15 is connected to VSS. A drain of the NMOS transistor M16 is connected to the drain of the PMOS transistor M14, a gate of the NMOS transistor M16 is connected to a gate of the PMOS transistor M13 and a source of the NMOS transistor M16 is connected to VSS.

A source of the PMOS transistor M17 is connected to the second power voltage VADDH. A source of the PMOS transistor M18 is connected to a drain of the PMOS transistor M17 and a gate of the PMOS transistor M18 is connected to a node N9. A drain of the NMOS transistor M19 is connected to a drain of PMOS transistor M18, a gate of the NMOS transistor M19 is connected to a gate of the PMOS transistor M18 and a source of the NMOS transistor M19 is connected to VSS. A drain of the NMOS transistor M20 is connected to the drain of the PMOS transistor M18, a gate of the NMOS transistor M20 is connected to a gate of the PMOS transistor M17 and a source of the NMOS transistor M20 is connected to VSS.

The first NOR GATE 242a of the reference logic circuit 240a receives a voltage of the node N8, i.e. the output of the fourth inverter 234, via the gates of the PMOS transistor M13 and the NMOS transistor M16. The first NOR GATE 242a of the reference logic circuit 240a receives a voltage of the node N7, i.e. the output of the third inverter 232, via the gates of the PMOS transistor M14 and the NMOS transistor M15.

The second NOR GATE 244a receives the voltage of the node N8 via the gate of the PMOS transistor M17 and the gate of the NMOS transistor M20, and receives a voltage of the node N9 via the gate of the PMOS transistor M18 and the gate of the NMOS transistor M19.

A third wide range signal, i.e. the voltage of the node N7, has an identical logic status to the small range input signal LI. A fourth wide range signal, i.e. the voltage of the node N8, has the reversed logic status with respect to the small range input signal LI.

Figure 4:
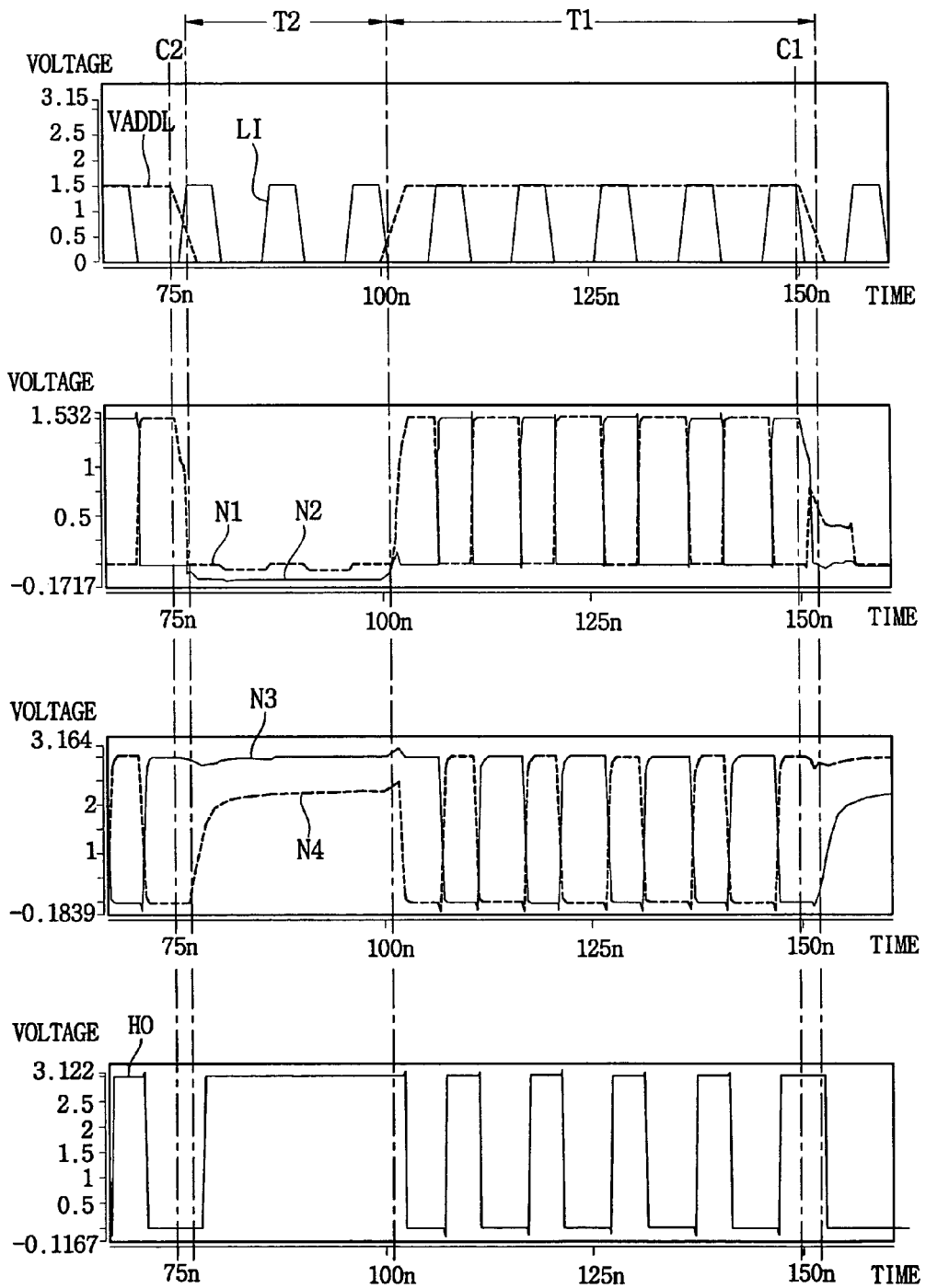
FIG. 4 is a timing diagram illustrating an operation of the low-to-high voltage level shifter of FIG. 3.

FIG. 4 is a timing diagram illustrating an operation of the low-to-high voltage level shifter of FIG. 3. Hereinafter, by way of illustrative example, the input signal LI has a frequency of 100 MHz, the second power voltage VADDH is 3.0 volts, and the first power voltage VADDL is 1.5 volts.

Hereinafter, the operation of the low-to-high voltage level shifter is described with reference to FIGS. 3 and 4. For example, the input signal LI is in a range from about 0 volt to the level of the first power voltage VADDL, and the first power voltage VADDL is about 1.5 volt.

First, the operation of the low-to-high voltage level shifter is illustrated when the first power voltage VADDL has a normal voltage level higher than the given voltage level.

When the first power voltage VADDL has the normal voltage level, the node N2 of the input buffer 210 has the first small range signal 213 having the same phase as the small range input signal LI, and the node N1 has the second small range signal 215 having a reversed-phase with respect to the small input range signal LI.

As shown in FIG. 4, in the case in which the input signal LI is changed from the low-voltage logic level 'LOW' to the low-voltage logic level 'HIGH' at C1 point (about 150 ns), the node N2 has the low-voltage logic level 'HIGH' (about 1.5 volt), and the node N1 has the low-voltage logic level 'LOW' (about 0 volt).

When the input signal LI has the low-voltage logic level 'HIGH', the node N3 has a logic status 'LOW' since the transistor M6 is turned on. When the node N3 has a voltage level low enough to turn on the transistor M7 (for example, V(N3)<VADDH−|Vthp|, Vthp is a threshold voltage of the transistor M7), the voltage of the node N4 substantially increases to the level of the second power voltage VADDH and the transistor M5 is turned on. As a result, a positive feedback loop is activated by the transistors M5 and M7. Concurrently, the transistors M6 and M7 are turned on and the transistors M5 and M8 are turned off. As shown in FIG. 4, the nodes N3 and N4 have the high-voltage logic level 'LOW' and 'HIGH', respectively, at time point C1.

While the first power voltage VADDL has the normal voltage level ('T1' period of FIG. 4), the transistor M6 is turned on. Furthermore, the transistor MSL is turned off, and a current path comprised of the transistors MSL and MDH is disabled because the voltage of the node N3 becomes lower than (VADDL+|Vthp|).

As the voltage of the node N3 decrease to below (V(N4)+ Vthn) (V(N4) is the voltage of node N4) by the positive feedback loop, the transistor MDL is turned off, and the current path comprised of the transistors MDL and MSH is disabled.

Consequently, while the first power voltage VADDL has the normal voltage level (during the time period 'T1' of FIG. 4), the current path comprised of the transistors MSL and MDH and the current path comprised of the transistors MDL and MSH are disabled. Furthermore, the positive feedback loop has the identical operation to the positive feedback loop of the level shifting circuit 120 of FIG. 1.

When the first power voltage VADDL has the normal voltage level, the current path comprised of the transistors MDL and MSH and the current path comprised of the transistors MSL and MDH are disabled. Because of the disablement of the current paths, the voltage level shifting circuit 220 has the identical operation to the positive feedback loop of the level shifting part 120 of FIG. 1.

The output buffer 230 inverts the voltage of the node N3 having a logic status 'LOW', and outputs the high-voltage logic level 'LOW' to the node N7.

In the case in which the node N7 has the high-voltage logic level 'HIGH' and the the node N8 has the high-voltage logic level 'LOW, the transistor M13 is turned on, the transistor M14 is turned off, the transistor M15 is turned on, and the node N9 has a high-voltage logic level 'LOW'.

In the case in which the node N8 has the high-voltage logic level 'LOW', the transistor M17 is turned on, and the transistor M20 is turned off. When the node N9 has the high-voltage logic level 'LOW', the transistor M18 is turned on, and the transistor M19 is turned off. Accordingly, the voltage of the high-voltage logic level 'HIGH' is outputted via the output node HO.

In the case in which the voltage of the node N7 and the voltage of the node N8 have a reversed phase with respect to each other, the high-voltage logic level identical to that of the voltage at the node N7 is outputted to the output node HO.

In the case in which the input signal LI has the low-voltage logic level 'LOW', the high-voltage logic level 'LOW' is outputted to the output node HO by the above mentioned operation.

Hereinafter, the operation of the level shifter is described for the case in which the first power voltage VADDL is lower than the given voltage level (a time period 'T2' of FIG. 4) because the first power voltage signal is not supplied to the level shifter, or is in a power-down mode. For example, the given voltage level is a substantially ground level. The given voltage level may be a threshold voltage of the NMOS transistor Vthn.

In the case in which the first power voltage VADDL is lower than the given voltage level, the voltages of the nodes N1 and N2 has substantially ground level.

When the nodes N1 and N2 have the low-voltage logic levels 'LOW' and 'HIGH', respectively, just before the first power voltage VADDL is changed from the normal voltage level to the given voltage level (at the time point 'C1' of FIG. 4), the transistors M6 and M7 are turned on, and the transistors M5 and M8 are turned off. Accordingly, the nodes N3 and N4 have the high-voltage logic levels 'LOW' and 'HIGH' (definite logic state), respectively. When the first power voltage VADDL is changed to the given voltage level and the nodes N1 and N2 have about the ground level, the transistors M6 and M8 are turned off, the transistor M5 is turned off, and the transistor M7 is turned on. Accordingly, the node N4 maintains the high-voltage logic level 'HIGH' and the node N3 has a floating state (or undefined logic status) due to the turning-off of the transistors M5 and M6. In the case in which the first power voltage VADDL is lower than the given voltage level, the node N3 has the floating status.

Inversely, in the case in which the nodes N1 and N2 have the low-voltage logic level 'HIGH' and 'LOW', respectively, just before the first power voltage VADDL is changed from the normal voltage level to the given voltage level (at time point 'C2' of FIG. 4), the transistors M5 and M8 are turned on, and the transistors M6 and M7 are turned off. Accordingly, the nodes N3 and N4 have the high-voltage logic level 'HIGH' and 'LOW', respectively. When the first power voltage VADDL is changed to the given voltage level and the nodes N1 and N2 have about the ground level, the transistors M6 and M8 are turned off, the transistor M7 is turned off and the transistor M5 is turned on. Thus, the node N3 has the high-voltage logic level 'HIGH' and the node N4 has the floating state due to the turn-off of the transistors M7, M8. In the case in which the first power voltage VADDL is lower than the given voltage level, the node N4 has the floating state.

Hereinafter, the operation of the level shifter is described for the case in which the node N3 has the high-voltage logic level 'HIGH' due to the turn-on of the transistor M5 only and the node N4 has the floating status.

The node N3 has the voltage of expression 1 below due to the turn-on of the transistor M5.

$$V(N3)=VADDH-\Delta 1 \qquad \text{<Expression 1>}$$

($\Delta 1$ is a turn-on voltage Vds1 between source and drain of the PMOS transistor M5)

The transistor MDL is turned on by the voltage V(N3) of the node N3. When the first power voltage VADDL is less than the given voltage level, the transistors MSH and MSL of the voltage level detecting circuit 224 are turned on. Accordingly, the voltage of the node N3 having the high-voltage logic level 'HIGH' is transmitted to the node N4 having the floating status via a local negative feedback loop comprised of the node N3, the transistor MDL, the transistor MSH and the node N4. The node N4 of the local feedback loop has a voltage level according to the following expression 2.

$$V(N4)=V(N3)-Vthn-\Delta 2=VADDH-\Delta 1-\Delta 2 \qquad \text{<Expression>2}$$

(Vthn is a threshold voltage of the transistor MDL or the transistor MDH, and $\Delta 2$ is a turn-on voltage Vds2 between source and drain of the transistor MSH or the transistor MSL)

The voltage of the node N4 is changed from the-floating status into a definite logic state satisfying expressions 2 and 3.

$$V(N4)<VADDH-Vthn-\Delta 2 \qquad \text{<Expression 3>}$$

The node N4 satisfies expression 4 below so that the transistor M5 may turn on.

$$V(N4)<VADDH-|Vthp| \qquad \text{<Expression 4>}$$

(Vthp is a threshold voltage of the PMOS transistor M5 or the PMOS transistor M7)

In the case in which a threshold voltage Vthn of the NMOS transistor MDL or the NMOS transistor MDH is higher than a magnitude of the threshold voltage (|Vthp|) of the PMOS transistors M5 and M7, the voltage of the node N4 satisfies expression 4, and the transistor M5 is turned on. Accordingly, the nodes N3 and N4 maintain the definite logic state rather than the floating state.

Even though the transistors M5, M6, M7 and M8 are turned off, and the nodes N3 and N4 have the definite logic status. In order to turn off the transistors M5 and M7, the voltages of the nodes N3 and N4 are higher than (VADDH−|Vthp|).

Specifically, in the case in which the voltages of the node N3 and/or node N4 having undetermined logic state becomes below (VADDH−|Vthp|) due to a noise coupling generated by neighboring circuits, the transistor M5 and/or the transistor M7 is turned on, and the node N3 and/or the node N4 has the high-voltage logic level 'HIGH'. Furthermore, when only the node N4 (or N3) has the high-voltage logic level 'HIGH', the transistor M5 (or M7) is turned off. Accordingly, the voltage of the node N3 (or N4) having the undetermined logic state is transmitted to the node N4 (or N3) having the undetermined logic state via a current path formed by a local negative feedback loop comprised of the node N4, the transistor MDH, the transistor MSL and the node N3. The voltage of the node N3 (or N4) is V(N4)–Vthn–Δ2 (or V(N3)–Vthn–Δ2).

In the case in which the voltage of the node N3 or N4 drops below (VADDH–|Vthp|), the voltage of the node N3 (or the node N4) has (VADDH–Δ1) according to expression 1 and the voltage of the node N4 (or the node N3) has (V(N3)–Vthn–Δ2) due to the operation of the transistors MDL, MSH, MSL and MDH of the voltage level detecting circuit 224, and thus only the transistor M5 (or the transistor M7) is turned on. Alternately, the voltages of the nodes N3 and N4 have the high-voltage logic level 'HIGH' equal to or higher than (VADDH–Vthn–Δ2) according to expression 2, and the transistors M5, M6, M7 and M8 are turned off.

When the voltage of the node N3 (or node N4) drops below (VADDH–Vthn–Δ2), the transistors MDL, MSH, MSL and MDH of the voltage level detecting circuit 224 maintains the voltage level of the node N3 (or node N4) as equal to or greater than (VADDH–Vthn–Δ2).

Figure 1:
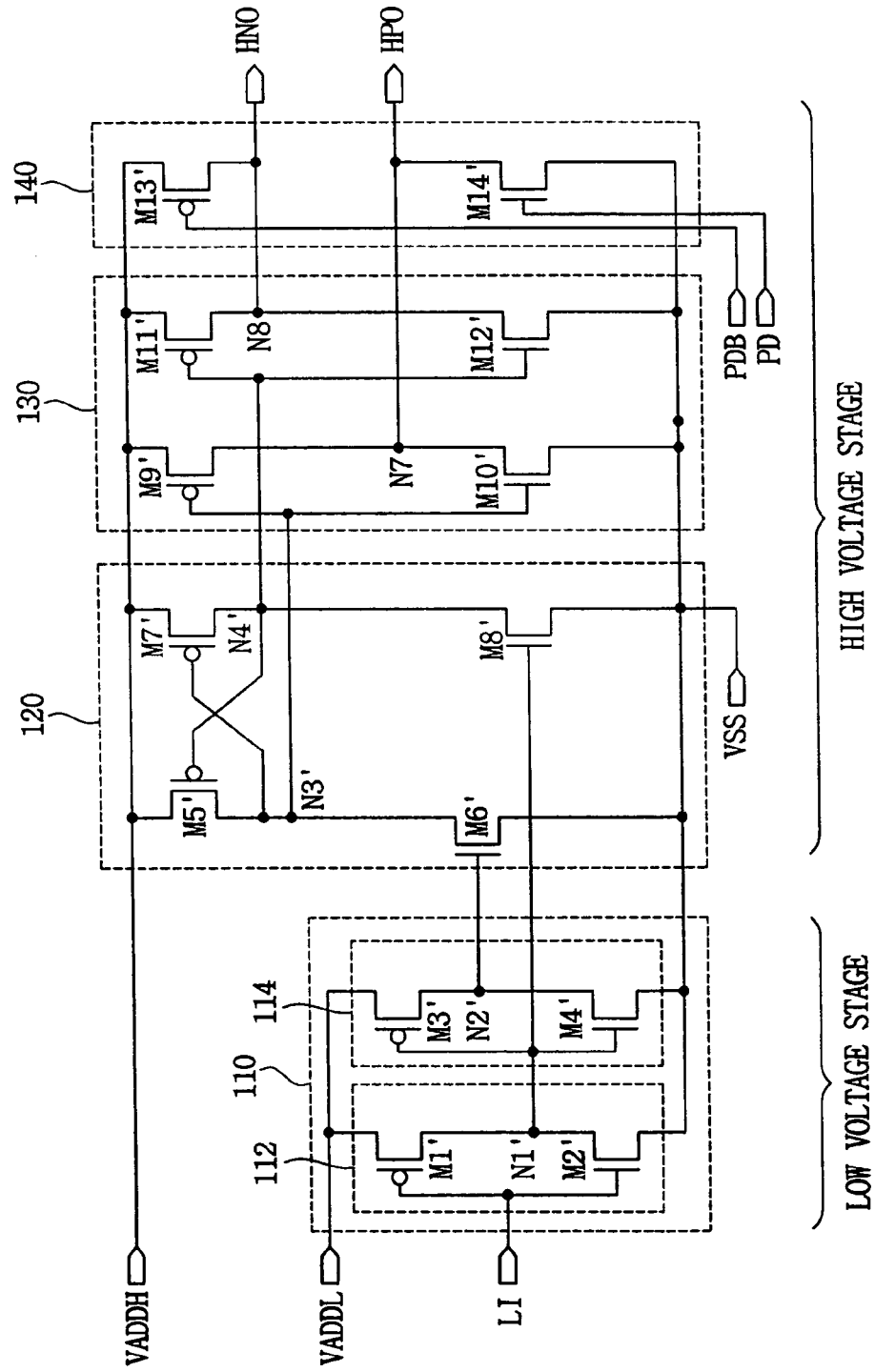
FIG. 1 is a circuit diagram of a conventional low-to-high voltage level shifter.

Because the node N3 (or N4) of the conventional low-to-high level shifter of FIG. 1 has a floating state and has undetermined logic status, the logic status of the node N3 (or N4) of FIG. 1 may not be defined. However, according to the level shifter of the exemplary embodiments of the present invention, the voltage level of the node N3 (or N4) is maintained to satisfy the condition of (V(N4) (or V(N3))> VADDH–Vthn–Δ2).

A channel length (L) of the NMOS transistor MDL (or MDH) may be controlled such that the threshold voltage Vthn of the NMOS transistor MDL (or MDH) is equal to or greater than the threshold voltage |Vthp| of the PMOS transistor M5 (or the PMOS transistor M7), thereby diminishing Δ2 of transistor MSH (or MSL). In order to restrict a leakage current of the first power voltage to smaller than about 1 uA, the channel length of the transistors MSH and MSL may be controlled. For example, the channel length of the transistor MSH (or MSL) may be about 1.3 to about 2 times as long as the channel length of the transistor MDL (or MDH).

The output buffer 230 changes the high-voltage logic level 'HIGH', which is defined by (VADDH–Δ1) of expression 1 or by (VADDH–Vthn–Δ2) of expression 3, of the node N3 or node N4 to a completely high-voltage logic level 'HIGH'. Accordingly, when the first power voltage VADDL is below the given voltage level, the output buffer 230 forces the voltages of the nodes N7 and N8 to satisfy the following expression 5.

$$V(N7)=V(N8) \qquad \text{<Expression 5>}$$

A logic reference voltage of the output buffer 230 may be about VADDH/2 when the first power voltage VADDL has the normal voltage level. In the case in which the first power voltage VADDL is below the given voltage level, the logic reference voltage of the output buffer 230 is about (VADDH–Vthn–Δ2)/2, for example, VADDH/3. For example, a ratio (W1/L1) of the channel width (W1) and the channel length (L1) of the transistor M9 (or the transistor M11) is substantially the same as a ratio (W2/L2) of the channel width (W2) and the channel length (L2) of the transistor M10 (or the transistor M12). For example, a ratio of W1/L1 to W2/L2 is about 1:1.

In the case in which the first power voltage VADDL is below the given voltage level, the node N7 has the high-voltage logic level 'LOW' that is the same as the logic level of the node N8. However, in the case in which the first power voltage VADDL has the normal voltage level, the node N7 has a logic level different from that of the node N8.

A logical disorder may occur under the following situation.

A logic status of the input signal LI is the same as a logic status of the output signal HO in the case in which the first power voltage VADDL has the normal voltage level, and the logic status of the input signal LI is different from the logic status of the output signal in the case in whichin the case in which the first power voltage VADDL is below the given voltage level.

Hence, the reference logic circuit 240a having two NOR combinational logic circuits is used to prevent the logical disorder. In particular, when the first power voltage VADDL is below the given voltage level, the reference logic circuit 240a generates the output signal HO having a fixed logic status regardless of the logic level of the input signal LI.

In the case in whichin the case in which the first power voltage VADDL is below the given voltage level—i.e. in the case in which the logic level of the node N7 is the same as the logic level of the node N8-, the reference logic circuit 240a having the two NOR combinational logic circuits 242a and 244a generates the fixed logic level such as the high-voltage logic level 'LOW'. In the case in which the first power voltage VADDL has the normal voltage level, i.e., in the case in which the logic level of the node N7 is different from the logic level of the node N8, the reference logic circuit 240a outputs the high-voltage logic level 'HIGH' having the same logic status as the input signal LI.

The reference logic circuit 240a having the two NOR combinational logic circuits 242a and 244a outputs the high-voltage logic level 'LOW' via the output node HO only when the nodes N7 and N8 have the same logic level such as the logic level 'LOW'. In detail, the first NOR GATE 242a receives V(N7) and V(N8), and outputs the high-voltage logic level 'HIGH' via the node N9. The second NOR GATE 244a receives V(N8) and V(N9), and outputs the logic level 'LOW' via the output node HO. Therefore, when the first power voltage VADDL is below the given voltage level, i.e., when the nodes N7 and N8 have the same logic level with each other, the reference logic circuit 240a outputs a predetermined logic status such as the high-voltage logic level 'LOW' via the output node HO.

When the nodes N7 and N8 have a different logic level from each other, the reference logic circuit 240a generates the high-voltage logic level 'LOW' via the node N9 that is an output node of the first NOR GATE 242a. The second NOR GATE 244a receives the V(N8) and the V(N9) (high-voltage logic level 'LOW'). Furthermore, the reference logic circuit 240a outputs inverted V(N8) via the output node HO. Therefore, in the case in which the first power voltage VADDL has the normal voltage level, i.e., the nodes N7 and N8 have different logic levels from each other, and the reference logic circuit 240a outputs an output signal HO having the same phase as the input signal LI.

Embodiment 2

Figure 5:
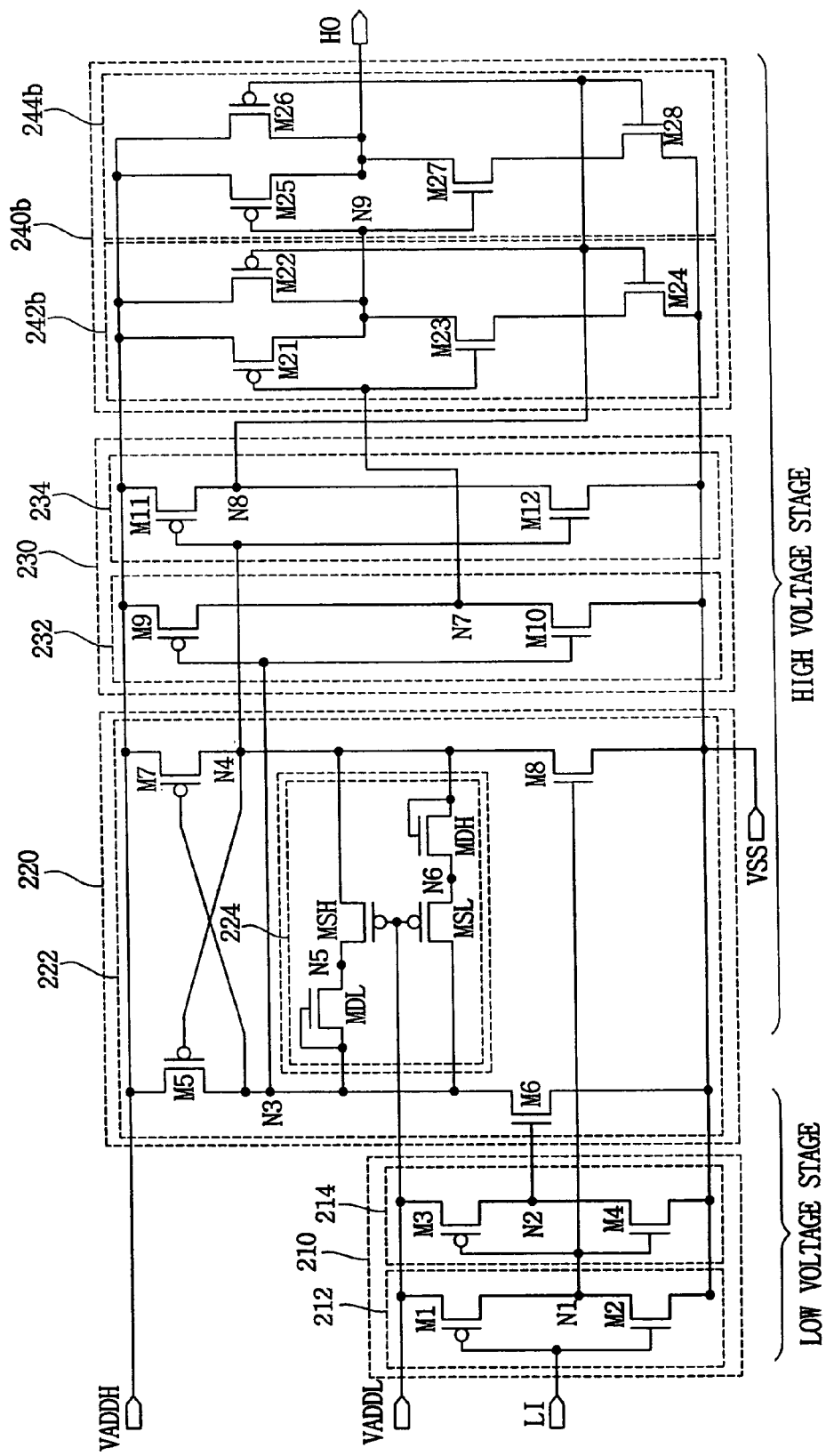
FIG. 5 is a circuit diagram of a low-to-high voltage level shifter of FIG. 2 according to a second exemplary embodiment of the present invention.

FIG. 5 is a circuit diagram of a low-to-high voltage level shifter of FIG. 2 according to a second exemplary embodiment of the present invention.

Referring to FIG. 5, the low-to-high level shifter according to the second exemplary embodiment of the present invention has a reference logic circuit 240b that has NAND GATEs instead of the NOR GATEs. That is, the reference logic circuit 240b is implemented by using two NAND GATEs instead of two NOR GATEs. When the first power voltage VADDL is below the given voltage level, the nodes N7 and N8 have the high-voltage logic level 'LOW' and the output signal HO has the high-voltage logic level 'HIGH'.

Hereinafter, an input buffer 210, a level shifting circuit 222, a voltage level detecting circuit 224 and an output buffer 230 of the low-to-high level shifter according to the second exemplary embodiment of the present invention are the same as those of the low-to-high level shifter according to the first exemplary embodiment of the present invention of FIG. 3. Therefore, the detailed descriptions of the same elements will not be repeated.

The reference logic circuit 240b has a first NAND GATE 242b and a second NAND GATE 244b. The first NAND GATE 242b has transistors M21, M22, M23 and M24, and the second NAND GATE 244b has transistors M25, M26, M27 and M28.

A source of the PMOS transistor M21 is connected to the second power voltage VADDH, and a gate of the PMOS transistor M21 is connected to a node N7. A source of the PMOS transistor M22 is connected to the second power voltage VADDH, and a drain of the PMOS transistor M22 is connected to a drain of the transistor M21 via a node N9. A gate of the NMOS transistor M23 is connected to the node N7, and a drain of the NMOS transistor M23 is connected to the node N9. A drain of the NMOS transistor M24 is connected to a source of the NMOS transistor M23, and a gate of the NMOS transistor M24 is connected to a gate of the PMOS transistor M22 and a node N8. Furthermore, a source of the transistor M24 is connected to VSS.

A source of the PMOS transistor M25 is connected to the second power voltage VADDH, and a gate of the PMOS transistor M25 is connected to the node N9. A source of the PMOS transistor M26 is connected to the second power voltage VADDH, and a drain of the PMOS transistor M26 is connected to a drain of the PMOS transistor M25 and the output node HO. A gate of the NMOS transistor M27 is connected to the node N9, and a drain of the NMOS transistor M27 is connected to the drains of the PMOS transistors M25 and M26. A drain of the NMOS transistor M28 is connected to a source of the NMOS transistor M27, a gate of the NMOS transistor M28 is connected to a gate of the NMOS transistor M26 and the node N8, and a source of the NMOS transistor M28 is connected to VSS.

The gates of the PMOS transistor M22 and the NMOS transistor M24 of the first NAND GATE 242b receive the voltage of the node N8 that is an output of a fourth inverter 234. The gates of the PMOS transistor M21 and the NMOS transistor M23 of the first NAND GATE 242b receive the voltage of the node N7 that is an output of a third inverter 232.

The gates of the PMOS transistor M26 and the NMOS transistor M28 of the second NAND GATE 244b receive the voltage of the node N8 that is an output of the fourth inverter 234. The gates of the PMOS transistor M25 and the NMOS transistor M27 receive the voltage of the node N9 that is an output of the first NAND GATE 242b.

A third wide range signal (the voltage of the node N7) has the same logic state as the small range input signal LI, and a fourth wide range signal (the voltage of the node N8) has a reversed logic state with respect to the small range input signal LI.

Figure 6:
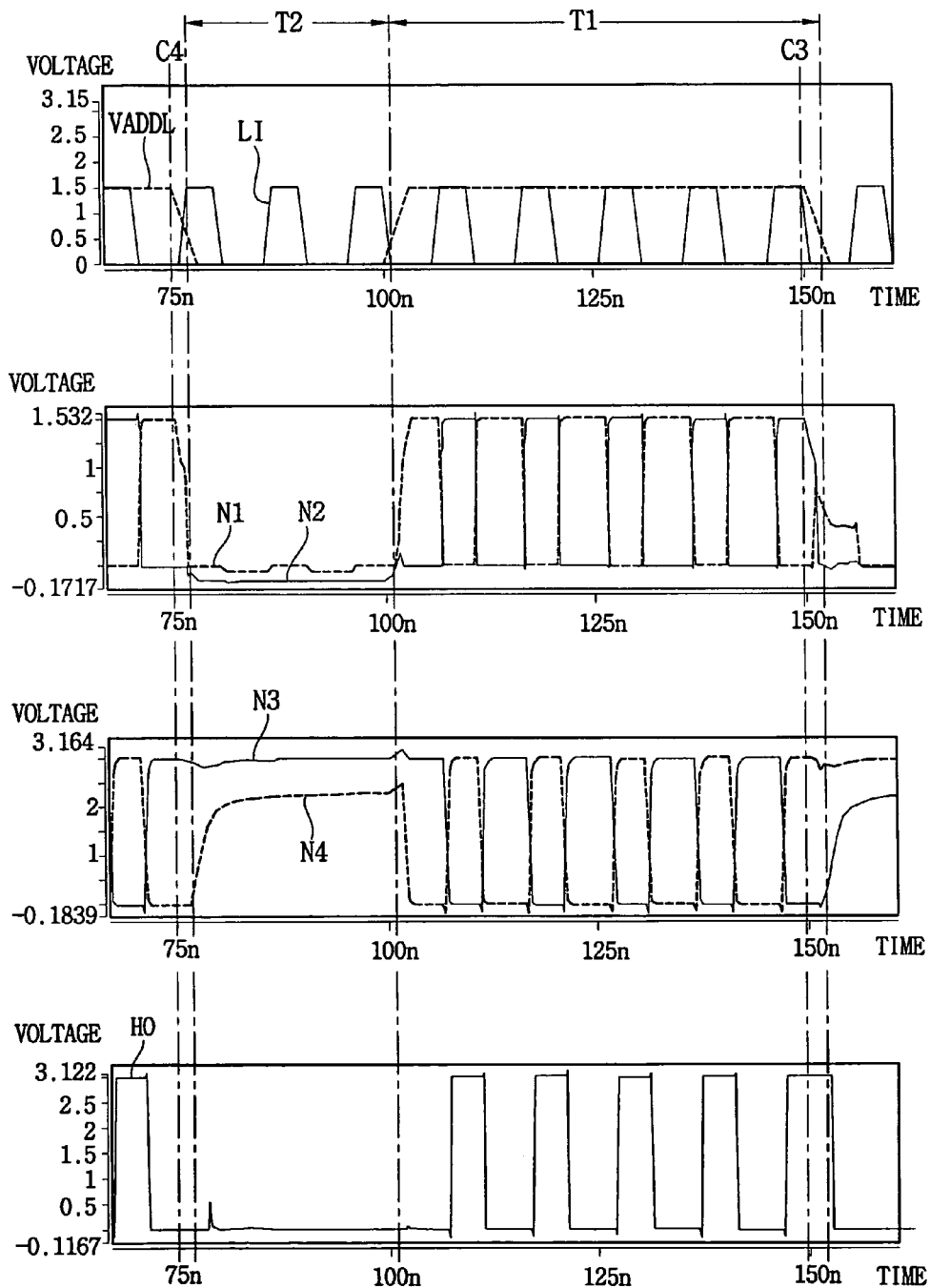
FIG. 6 is a timing diagram illustrating an operation of the low-to-high voltage level shifter of FIG. 5.

FIG. 6 is a timing diagram illustrating an operation of the low-to-high voltage level shifter of FIG. 5. In FIG. 6, the input signal is assumed, for purposes of illustration, to have a frequency of 100 MHz, the second power voltage VADDH is 3.0 volts, and the first power voltage VADDL is 1.5 volts.

Hereinafter, referring to FIGS. 5 and 6, the operation of the level shifter of FIG. 5 is described.

In the case in which the first power voltage VADDL is higher than the normal voltage level (time period 'T1' of FIG. 6), a change of the input signal LI from the low-voltage logic level 'LOW' to the low-voltage logic level 'HIGH' (time period 'C4' of FIG. 6 at about 75 ns) generates the low-voltage logic level 'HIGH' (for example, about 1.5 volt) at the node N2 and generates the low-voltage logic 'LOW' (for example, about 0 volt) at the node N1. Furthermore, in the case in which the input signal LI is changed from the low-voltage logic level 'HIGH' to the low-voltage logic level 'LOW' (time period 'C3' of FIG. 6 at about 150 ns), the node N2 has the low-voltage logic level 'LOW' (for example, about 0 volt) and the node N1 has the low-voltage logic level 'HIGH' (for example, about 1.5 volt).

When the input signal LI has the low-voltage logic level 'HIGH', the nodes N4 and N3 have respectively the high-voltage logic level 'HIGH' and 'LOW' (time period 'C3' of FIG. 6 at about 75 ns).

In the case in which the node N7 has the high-voltage logic level 'HIGH' and the node N8 has the high-voltage logic level 'LOW', the transistor M21 is turned off, the transistors M22 and M23 are turned on, and the transistor M24 is turned off. Therefore, the node N9 has the high-voltage logic level 'HIGH'.

When the node N8 has the high-voltage logic level 'LOW', the transistor M26 is turned on, and the transistor M28 is turned off. When the node N9 has the high-voltage logic level 'HIGH', the transistor M27 is turned on, and the transistor M25 is turned off. Therefore, the high-voltage logic level 'HIGH' having the same phase with respect to the input signal LO is outputted to the output node HO.

In the case in which the first power voltage VADDL has the normal voltage level and the voltage of the node N7 has the reversed phase with respect to the voltage of the node N8, the node N8 has the same high-voltage logic level as that of the node N8.

In addition, in the case in which the input signal LI has the low-voltage logic level 'LOW' under the condition that the first power voltage VADDL has the normal voltage level, the output node HO has the same logic status (the high-voltage logic level 'LOW') as the input signal LO.

The reference logic circuit 240b having the two NAND GATEs 242b and 244b, when the first power voltage VADDL is below the given voltage level, i.e., the logic level of the node N7 is the same as the logic level of the node N8, outputs the high-voltage logic level 'HIGH' to the output node HO. When the first power voltage VADDL has the normal voltage level, i.e. the logic level of the node N7 is different from the logic level of the node N8, the reference logic circuit 240b outputs the high-voltage logic level 'HIGH' having the same phase as the input signal LI. Furthermore, when the first power voltage VADDL is below the given voltage level, the node N7 has the high-voltage logic level 'LOW' identical to the logic level of the node N8.

When the first power voltage VADDL has the normal voltage level, the logic level of the node N7 is different from that of the node N8.

The reference logic circuit 240b outputs the high-voltage logic level 'HIGH' to the output node HO only when the first power voltage VADDL is below the given voltage level, i.e., the nodes N7 and N8 have the high-voltage logic level 'LOW'. In particular, the first NAND GATE 242b receives the V(N7) and V(N8) having the high-voltage logic level 'LOW' and outputs the high-voltage logic level 'HIGH' to the node N9 that is the output node of the first NAND GATE 242b. The second NAND GATE 244b receives V(N8) and V(N9), and outputs the high-voltage logic level 'HIGH' to the output node HO of the second NAND GATE 244b. Therefore, when the first power voltage VADDL is below the given voltage level, i.e. the nodes N7 and N8 have the same logic level with each other, the output signal HO of the reference logic circuit 240b is the high-voltage logic level 'HIGH'.

When the nodes N7 and N8 have different logic level from each other, the reference logic circuit 240b generates the high-voltage logic level 'HIGH' via the node N9 that is the output node of the first NAND GATE 242b. Furthermore, the second NAND GATE 244b receives the V(N9) having the high-voltage logic level 'HIGH' and V(N8), and outputs an inverted V(N8) to the output node HO of the second NAND GATE 242b. Therefore, when the first power voltage VADDL has the normal voltage level, i.e., the nodes N7 and N8 have the different logic level from each other, the reference logic circuit 240b output the output signal HO having the same phase as that of the input signal LI.

According to the level shifter of the above described embodiments of the present invention, leakage current may be reduced when the level shifter is used in a multi-power system or a multiple supply voltage application, to which the small range power voltage and the wide range power voltage are supplied. Such applications include, for example, portable devices, which require low power consumption, such as laptop computers, PDA (Personal Digital Assistants) or mobile phones, etc. The leakage current of the level shifter may be decreased by about 10 times compared with the conventional level shifter using the pull-up/pull-down circuit. In addition, in the multiple supply voltage application, the power consumption of the level shifter may be reduced by switching the power voltage between a given voltage level and a normal voltage level.

The level shifter according to the above described embodiments of the present invention, when the small range power voltage is disabled, detects whether the small range power voltage is below the given voltage level. In the case in which the small range power voltage is higher than the given voltage level, the level shifter according to the present invention performs the same operation as the conventional level shifter. When the small range power voltage is below the given voltage level, the level shifter according to the present invention outputs the wide range signal having the predetermined high-voltage logic level by using the NOR (or NAND) combinational logic circuit.

The level shifter according to the above described embodiments of the present invention employs the NAND (or NOR) combinational logic circuit instead of the pull-up/pull-down circuit that consumes the static current. Thus, the level shifter may output the wide range signal having the predetermined logic level even when the small range stage driven by the small range power voltage is disabled.

In addition, the leakage current generated from the pull-up/pull-down circuit of the conventional level shifter may be reduced by using the combinational logic circuit instead of using the pull-up/pull-down circuit consuming a static current.

In addition, in the case in which the portable device such as a mobile phone is turned off during a sleep mode (or standby mode) so as to reduce the power consumption of the portable device, the ground level of the power voltage of the portable device is detected, and the output of the level shifter is fixed to the predetermined logic level. Therefore, the logic disorder of surrounding circuits of the level shifter due to the generation of the indefinite logic state of the level shifter may be prevented.

In addition, since the voltage level of the power voltage in the low voltage stage is directly detected, the control signals (PD, PDB of FIG. 1) of the conventional level shifter are not required.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A level shifter comprising:
   an input buffer, coupled to a first power voltage, configured to buffer an input signal swinging between a base level and a first voltage level to output a first small range signal having a reversed phase with respect to the input signal, and a second small range signal having substantially the same phase with respect to the input signal;
   a level shifting circuit having a first node and a second node, coupled to a second power voltage higher than the first power voltage, configured to transform the first and second small range signals into a first wide range signal and a second wide range signal, respectively, to output the first wide range signal via the first node and the second wide range signal via the second node when the first power voltage is higher than a given specified voltage level, the first and second wide range signals swinging between the base level and a second voltage level higher than the first voltage level;
   a voltage level detecting circuit configured to detect whether the first power voltage is lower than the given specified voltage level, and configured to maintain voltage levels of the first and second nodes as higher than or equal to a third voltage level to prevent floating of the first and second nodes by forming at least one of a first conduction path and a second conduction path through the voltage level detecting circuit between the first and second nodes when the first power voltage is lower than the specified voltage level, the third voltage level being lower than the second voltage level;
   an output buffer configured to buffer the first and second wide range signals to output third and fourth wide range signals; and
   a reference logic circuit, the reference logic circuit receiving the third and fourth wide range signals, outputting a fifth wide range signal having substantially the same phase with respect to the input signal when the first power voltage is equal to or greater than the given specified voltage level, and outputting the fifth wide range signal having a predetermined logic level regardless of the logic level of the input signal when the first power voltage is lower than the given specified voltage level.

2. The level shifter of claim 1, wherein the input buffer comprises:
   a first inverter, coupled to the first power voltage, configured to invert the input signal to output the first small range signal; and
   a second inverter, coupled to the first power voltage, configured to invert the first small range signal to output the second small range signal.

3. The level shifter of claim 1, wherein the output buffer comprises:
   a third inverter, coupled to the second power voltage, configured to invert the first wide range signal to output a third wide range signal; and
   a fourth inverter, coupled to the second power voltage, configured to invert the second wide range signal to output a fourth wide range signal.

4. The level shifter of claim 3, wherein a logic reference voltage of the third inverter or the fourth inverter corresponds to ⅓ of the second power voltage.

5. The level shifter of claim 1, wherein the reference logic circuit comprises:
   a first NOR circuit configured to perform a NOR operation on the third and fourth wide range signals; and
   a second NOR circuit configured to perform the NOR operation on an output of the first NOR circuit and the fourth wide range signal.

6. The level shifter of claim 1, wherein the reference logic circuit comprises:
   a first NAND circuit configured to perform a NAND operation on the third and fourth wide range signals; and
   a second NAND circuit configured to perform the NAND operation on an output signal of the first NAND circuit and the fourth wide range signal.

7. The level shifter of claim 1, wherein the level shifting circuit comprises:
   a first NMOS transistor having a control electrode for receiving the first small range signal;
   a second NMOS transistor having a control electrode for receiving the second small range signal;
   a first PMOS transistor having a first current electrode coupled to the second power voltage and a second current electrode coupled to a second current electrode of the first NMOS transistor; and
   a second PMOS transistor having a first current electrode coupled to the second power voltage, a second current electrode coupled to a second current electrode of the second NMOS transistor and a control electrode of the first PMOS transistor, and a control electrode coupled to the second current electrode of the first PMOS transistor.

8. The level shifter of claim of 7, wherein the voltage level detecting circuit comprises:
   a first transistor having a second current electrode and a control electrode commonly coupled to the second current electrode of the first PMOS transistor;
   a second transistor having a first current electrode coupled to a first electrode of the first transistor, a control electrode coupled to the first power voltage, and a second current electrode coupled to the second current electrode of the second PMOS transistor;
   a third transistor having a second current electrode and a control electrode commonly coupled to the second current electrode of the second PMOS transistor; and
   a fourth transistor having a first current electrode coupled to a first current electrode of the third transistor, a control electrode coupled to the first power voltage, and a second current electrode coupled to the second current electrode of the first PMOS transistor.

9. The level shifter of claim 8, wherein a ratio of a channel length of the second transistor to a channel length of the first transistor is in a range from about 1.3:1 to about 2:1.

10. The level shifter of claim 1, wherein the voltage level detecting circuit detects the specified voltage level when the first and second nodes have the third voltage level.

11. The level shifter of claim 1, wherein the voltage level detecting circuit comprises:
   a first current path for forming the first conduction path between the first and second nodes, for transmitting the first wide range signal having a high-voltage logic 'high' to the second node when the first power voltage is less than the specified voltage level, so that the second node is maintained as substantially the third voltage level; and
   a second current path for forming the second conduction path between the first and second nodes, for transmitting the second wide range signal having the high-voltage logic 'high' to the first node when the first power voltage is less than the specified voltage level, so that the first node is maintained as substantially the third voltage level,
   wherein the first and second current paths are disabled while the first power voltage is higher than the specified voltage level.

12. A level shifter comprising:
   an input terminal coupled to an input signal having a small range swinging between a base level and a first voltage level;
   a first power supply voltage terminal coupled to a first power supply voltage;
   a second power supply voltage terminal coupled to a second power voltage higher than the first power voltage;
   an input buffer, coupled to the first power voltage, configured to buffer the input signal to output a first small range signal having a reversed phase with respect to the input signal, and a second small range signal having substantially the same phase with respect to the input signal;
   a level shifting circuit having a first node and a second node, the level shifting circuit coupled to the input buffer and the second power voltage terminal, voltage, configured to transform the first and second small range signals into a first wide range signal and a second wide range signal, respectively, when the first power voltage is higher than a specified voltage level, and configured to output the first and second wide range signals via the first and second nodes, respectively, the second wide range signal swinging between the base level and a second voltage level higher than the first voltage level;
   a voltage level detecting circuit coupled to the level shifting circuit and the second voltage terminal, configured to detect whether the first power voltage is lower than the given specified voltage level, and configured to maintain voltage levels of the first and second nodes as higher than or equal to a third voltage level to prevent floating of the first and second nodes by forming at least one of a first conduction path and a second conduction path through the voltage level detecting circuit between the first and second nodes when the first power voltage is lower than the specified voltage level, an output buffer configured to buffer the first and second wide range signals to output third and fourth wide range signals; and a reference logic circuit, the reference logic circuit receiving the third and fourth wide range signals, outputting a fifth wide range signal having substantially the same phase with respect to the input signal when the first power voltage is equal to or greater than the given specified voltage level, and outputting the fifth wide range signal having a predetermined logic level regardless of the logic level of the input signal when the first power voltage is lower than the given specified voltage level.

13. The level shifter of claim 12, wherein the reference logic circuit comprises:
   a first NOR circuit configured to perform a NOR operation on the third and fourth wide range signals; and
   a second NOR circuit configured to perform the NOR operation on an output of the first NOR circuit and the fourth wide range signal.

14. The level shifter of claim 12, wherein the reference logic circuit comprises:
   a first NAND circuit configured to perform a NAND operation on the third and fourth wide range signals; and
   a second NAND circuit configured to perform the NAND operation on an output signal of the first NAND circuit and the fourth wide range signal.

15. The level shifter of claim 12, wherein the voltage level detecting circuit comprises:
   a first current path for forming the first conduction path between the first and second nodes, for transmitting the first wide range signal having a high-voltage logic 'high' to the second node when the first power voltage is less than the specified voltage level, so that the second node is maintained as substantially the third voltage level; and
   a second current path for forming the second conduction path between the first and second nodes, for transmitting the second wide range signal having the high-voltage logic 'high' to the first node when the first power voltage is less than the specified voltage level, so that the first node is maintained as substantially the third voltage level, wherein the first and second current paths are disabled while the first power voltage is higher than the specified voltage level.

16. A level shifter comprising:
   a first inverter coupled to a first power voltage, configured to invert an input signal to output a first small range signal having a reversed phase with respect to the input signal;
   a second inverter coupled to the first power voltage, configured to invert the first small range signal to output a second small range signal having substantially the same phase with respect to the input signal;
   a first NMOS transistor having a control electrode coupled to the first small range signal;
   a second NMOS transistor having a control electrode coupled to the second small range signal;
   a first PMOS transistor having a first current electrode coupled to a second power voltage and a second current electrode coupled to a second current electrode of the first NMOS transistor, the second power voltage being higher than the first power voltage;
   a second PMOS transistor having a first current electrode coupled to the second power voltage, a second current electrode coupled to a second current electrode of the second NMOS transistor and a control electrode of the first PMOS transistor, and a control electrode coupled to the second current electrode of the first PMOS transistor;
   a first transistor having a second current electrode and a control electrode commonly coupled to the second current electrode of the first PMOS transistor;
   a second transistor having a control electrode coupled to the first power voltage, configured to be turned on to form a first conduction path between the first and second PMOS transistors when the first power voltage is lower than a specified voltage level;
   a third transistor having a second current electrode and a control electrode commonly coupled to the second current electrode of the second PMOS transistor; and
   a fourth transistor having a control electrode coupled to the first power voltage, configured to be turned on to form a second conduction path between the first and second PMOS transistors when the first power voltage is lower than the specified voltage level.

17. A level shifter comprising:
   an input buffer, coupled to a first power voltage, configured to buffer an input signal swinging between a base level and a first voltage level to output a small range signal;
   a level shifting circuit having a first node and a second node, the level shifting circuit coupled to a second power voltage higher than the first power voltage, configured to transform the small range signal into a first wide range signal to output the first wide range signal when the first power voltage is higher than a specified voltage level, the first wide range signal swinging between the base level and a second voltage level higher than the first voltage level;
   a voltage level detecting circuit between the first node and the second node, the voltage level detecting circuit configured to detect whether the first power voltage is lower than the specified voltage level, and configured to maintain a voltage level of the first wide range signal as higher than or equal to a third voltage level by forming at least one of a first conduction path and a second conduction path through the voltage level detecting circuit between the first and second nodes when the first power voltage is lower than the specified voltage level, the third voltage level being lower than the second voltage level;
   an output buffer configured to buffer the first and second wide range signals to output third and fourth wide range signals; and
   a reference logic circuit, the reference logic circuit receiving the third and fourth wide range signals, outputting a fifth wide range signal having substantially the same phase with respect to the input signal when the first power voltage is equal to or greater than the given specified voltage level, and outputting the fifth wide range signal having a predetermined logic level regardless of the logic level of the input signal when the first power voltage is lower than the given specified voltage level.

18. A level shifting method comprising:
   receiving a first power voltage, and buffering an input signal swinging between a base level and a first voltage level to output a first small range signal having a reversed phase with respect to the input signal and a second small range signal having substantially the same phase with respect to the input signal;

receiving a second power voltage higher than the first power voltage, and transforming the first and second small range signals into a first wide range signal and a second wide range signal, respectively, to output the first and second wide range signals via first and second nodes, respectively when the first power voltage is higher than a specified voltage level, the first and second wide range signals swinging between the base level and a second voltage level higher than the first voltage level;

maintaining voltage levels of the first and second wide range signals at the first and second nodes as higher than or equal to a third voltage level when the first power voltage is lower than the specified voltage level by forming a conduction path between the first and second nodes, the third voltage level being lower than the second voltage level;

buffering the first and second wide range signals to output third and fourth wide range signals, respectively, swinging between the base level and the second voltage level;

outputting a fifth wide range signal having substantially the same phase with respect to the input signal when the first power voltage is equal to or greater than the specified voltage level; and outputting the fifth wide range signal having a predetermined logic level regardless of the logic level of the input signal when the first power voltage is lower than the specified voltage level.

19. A level shifting method comprising:

receiving a first power voltage, and buffering an input signal swinging between a base level and a first voltage level to output a small range signal swinging between the base level and the first voltage level;

receiving a second power voltage higher than the first power voltage, and transforming the small range signal into a first wide range signal when the first power voltage is higher than a specified voltage level, the first wide range signal swinging between the base level and a second voltage level higher than the first voltage level;

maintaining a voltage level of the first wide range signal as higher than or equal to a third voltage level when the first power voltage is lower than the specified voltage level, the third voltage level being lower than the second voltage level;

buffering the first wide range signal to output a second wide range signal swinging between the base level and the second voltage level;

outputting a third wide range signal having substantially the same phase with respect to the input signal when the first power voltage is equal to or greater than the specified voltage level; and outputting the third wide range signal having a predetermined logic level regardless of the logic level of the input signal when the first power voltage is lower than the specified voltage level.

* * * * *

UNITED STATES PATENT AND TRADEMARK OFFICE
CERTIFICATE OF CORRECTION

PATENT NO. : 7,112,996 B2
APPLICATION NO. : 10/894679
DATED : September 29, 2006
INVENTOR(S) : Lee It is certified that error appears in the above-identified patent and that said Letters Patent is hereby corrected as shown below:

Column 18, line 40, delete "given"

Column 18, line 45, delete "given"

Column 18, line 66, delete "given"

Column 20, line 33, delete "supply"

Column 20, line 34, delete "supply"

Column 20, line 35, delete "supply"

Column 20, line 47, delete "voltage,"

Column 20, line 49, delete "a first wide range signal and a second wide range signal," and insert --first and second wide range signals,--

Column 20, line 57, insert --power-- between "second" and "voltage"

Column 20, line 59, delete "given"

Column 20, line 67, insert --the third voltage level being lower than the second voltage level;-- after "level,"

Column 21, line 4, insert --coupled to the second power voltage terminal-- between "circuit" and ", the"

Column 21, line 8, delete "given"

Column 21, line 12, delete "given"

Column 22, lines 49-51, delete "and second wide range signals to output third and fourth wide range signals;" and insert --wide range signal to output a second wide range signal, the second wide range signal swinging between the base level and the second voltage level;--

Column 22, lines 53-54, delete "third and fourth wide range signals, outputting a fifth" and insert --second wide range signal from the output buffer, outputting a third--

Column 22, line 56, delete "given"

UNITED STATES PATENT AND TRADEMARK OFFICE
CERTIFICATE OF CORRECTION

PATENT NO. : 7,112,996 B2
APPLICATION NO. : 10/894679
DATED : September 29, 2006
INVENTOR(S) : Lee It is certified that error appears in the above-identified patent and that said Letters Patent is hereby corrected as shown below:

Column 22, line 57, delete "fifth" and insert --third--

Column 22, line 60, delete "given"

Signed and Sealed this

Twenty-ninth Day of May, 2007

JON W. DUDAS
*Director of the United States Patent and Trademark Office*

UNITED STATES PATENT AND TRADEMARK OFFICE
CERTIFICATE OF CORRECTION

PATENT NO. : 7,112,996 B2
APPLICATION NO. : 10/894679
DATED : September 26, 2006
INVENTOR(S) : Lee It is certified that error appears in the above-identified patent and that said Letters Patent is hereby corrected as shown below:

Column 18, line 40, delete "given"

Column 18, line 45, delete "given"

Column 18, line 66, delete "given"

Column 20, line 33, delete "supply"

Column 20, line 34, delete "supply"

Column 20, line 35, delete "supply"

Column 20, line 47, delete "voltage,"

Column 20, line 49, delete "a first wide range signal and a second wide range signal," and insert --first and second wide range signals,--

Column 20, line 57, insert --power-- between "second" and "voltage"

Column 20, line 59, delete "given"

Column 20, line 67, insert --the third voltage level being lower than the second voltage level;-- after "level,"

Column 21, line 4, insert --coupled to the second power voltage terminal-- between "circuit" and ", the"

Column 21, line 8, delete "given"

Column 21, line 12, delete "given"

Column 22, lines 49-51, delete "and second wide range signals to output third and fourth wide range signals;" and insert --wide range signal to output a second wide range signal, the second wide range signal swinging between the base level and the second voltage level;--

Column 22, lines 53-54, delete "third and fourth wide range signals, outputting a fifth" and insert --second wide range signal from the output buffer, outputting a third--

Column 22, line 56, delete "given"

UNITED STATES PATENT AND TRADEMARK OFFICE
CERTIFICATE OF CORRECTION

| | | |
|---|---|---|
| PATENT NO. | : 7,112,996 B2 | Page 2 of 2 |
| APPLICATION NO. | : 10/894679 | |
| DATED | : September 26, 2006 | |
| INVENTOR(S) | : Lee | |

It is certified that error appears in the above-identified patent and that said Letters Patent is hereby corrected as shown below:

Column 22, line 57, delete "fifth" and insert --third--

Column 22, line 60, delete "given"

This certificate supersedes Certificate of Correction issued May 29, 2007.

Signed and Sealed this

Nineteenth Day of June, 2007

JON W. DUDAS
*Director of the United States Patent and Trademark Office*